US010727431B2

(12) United States Patent
Falk et al.

(10) Patent No.: US 10,727,431 B2
(45) Date of Patent: Jul. 28, 2020

(54) OPTOELECTRONIC DEVICES BASED ON INTRINSIC PLASMON-EXCITON POLARITONS

(71) Applicant: International Business Machines Corporation, Armonk, NY (US)

(72) Inventors: Abram L. Falk, Port Chester, NY (US); Damon B. Farmer, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 208 days.

(21) Appl. No.: 16/022,969

(22) Filed: Jun. 29, 2018

(65) Prior Publication Data

US 2020/0006690 A1 Jan. 2, 2020

(51) Int. Cl.
*H01L 51/50* (2006.01)
*H01L 51/00* (2006.01)
*H01L 51/42* (2006.01)
*H01L 51/44* (2006.01)
*H01L 51/52* (2006.01)
*B82Y 20/00* (2011.01)

(52) U.S. Cl.
CPC ...... *H01L 51/5012* (2013.01); *H01L 51/0048* (2013.01); *H01L 51/4213* (2013.01); *H01L 51/44* (2013.01); *H01L 51/5262* (2013.01); *B82Y 20/00* (2013.01)

(58) Field of Classification Search
None
See application file for complete search history.

(56) References Cited

U.S. PATENT DOCUMENTS

| 8,129,710 B2 | 3/2012 | Cho et al. |
| 8,368,050 B2 | 2/2013 | Fattal et al. |
| 8,471,238 B2 | 6/2013 | Ward et al. |
| 8,611,067 B1 | 12/2013 | Pearson et al. |
| 8,802,965 B2 | 8/2014 | Lindquist et al. |

(Continued)

FOREIGN PATENT DOCUMENTS

CN     101295767 A     10/2008

OTHER PUBLICATIONS

Bondarev et al., Strongly Coupled Surface Plasmon-Exciton Excitations in Small-Diameter Carbon Nanotubes, 2008 Conference on Lasers and Electro-Optics and 2008 Conference on Quantum Electronics and Laser Science, Jul. 22, 2008.

(Continued)

*Primary Examiner* — Lex H Malsawma
(74) *Attorney, Agent, or Firm* — Garg Law Firm, PLLC; Rakesh Garg; Vazken Alexanian

(57) ABSTRACT

A semiconductor device includes a ribbon of a thickness and a width. A material of the ribbon is configured to host excitons as well as plasmons, and the width is an inverse function of a wavector value at which an energy level of plasmons in the material substantially equals an energy level of excitons in the material. The substantially equal energies of the plasmons and the excitons in the ribbon cause an excitation of intrinsic plasmon-exciton polaritons (IPEPs) in the ribbon. A first contact electrically couples to a first location on the ribbon, and a second contact electrically couples to a second location on the ribbon.

20 Claims, 13 Drawing Sheets

(56) References Cited

U.S. PATENT DOCUMENTS

| | | | |
|---|---|---|---|
| 8,895,997 | B2 | 11/2014 | Maki et al. |
| 8,951,561 | B2 | 2/2015 | Vo-Dinh et al. |
| 9,423,345 | B2* | 8/2016 | Avouris ............ H01L 21/02422 |
| 9,643,841 | B2 | 5/2017 | Akyildiz et al. |
| 2009/0267049 | A1 | 10/2009 | Cho et al. |
| 2012/0327502 | A1* | 12/2012 | Zheludev ............... G02B 1/002 |
| | | | 359/291 |
| 2014/0353577 | A1 | 12/2014 | Agarwal et al. |
| 2018/0252947 | A1* | 9/2018 | Rupasinghe .......... G02F 1/0081 |

OTHER PUBLICATIONS

PCT, International Searching Authority, PCT/IB2019/054989, dated Oct. 12, 2019.

V. Bondarev et al., "Strong exciton-plasmon coupling in semiconducting carbon nanotubes," Physical Review B, vol. 80, No. 8, 2009, 085407, 20 pages.

C. Chiu et al., "Strong and broadly tunable plasmon resonances in thick films of aligned carbon nanotubes," Nano Letters, vol. 17, No. 9, 2017, pp. 5641-5645.

L. Falk et al., "Coherent plasmon and phonon-plasmon resonances in carbon nanotubes," Physical Review Letters, vol. 118, No. 25, 2017, 257401, 6 pages.

Ho et al, "Intrinsically ultrastrong light-matter interactions in crystalline films of carbon nanotubes", arXiv 1803.01087, 2018 (https://arxiv.org/abs/1803.01087).

\* cited by examiner

OPTOELECTRONIC DEVICES BASED ON INTRINSIC PLASMON-EXCITON POLARITONS

TECHNICAL FIELD

The present invention relates generally to a method, system, and computer program product for fabricating optoelectronic semiconductor devices. More particularly, the present invention relates to a method, system, and computer program product for optoelectronic devices based on intrinsic plasmon-exciton polaritons.

BACKGROUND

An optoelectronic device is a device that exhibits a relationship between the device's optical characteristics and the device's electrical characteristics. For example, some optoelectronic devices accept visible light, infrared light, ultraviolet light, x-rays, or electromagnetic waves in other wavelengths, and produce a potential difference or voltage across a set of terminals. A photodiode is an example of this type of photodetector optoelectronic devices. Some optoelectronic devices similarly accept light or electromagnetic waves in other wavelengths, and switch from conducting to non-conducting or vice-versa, for electrical current configured to pass through the device.

Some other optoelectronic devices accept an electrical current as input and output visible light, infrared light, ultraviolet light, x-rays, or electromagnetic waves in other wavelengths. This type of optoelectronic device is called a light-emitting diode, or a photoemitter. A photodetector or a photoemitter optoelectronic device fabricated at a semiconductor device scale using semiconductor materials and fabrication technology is a semiconductor optoelectronic device.

Surface plasmons (also referred to herein as simply "plasmons") and excitons are both important optoelectronic phenomena. Surface plasmons are charge oscillations coupled to optical fields. Plasmons can concentrate optical fields into nanoscale volumes and enhance the efficiency of photodetectors. This concentration of optical fields can also serve to enhance the rate of luminescence from nearby optically or electrically driven emitters.

Excitons comprise electrons bound to electron holes in semiconductors. Excitons are an important process in both photoemission and photodetection, particularly in organic molecules and nanomaterials, where the Coulomb binding strength between electrons and holes is especially strong.

Surface plasmons can hybridize with excitons when they are brought close together. When a surface plasmon is sufficiently strongly coupled to an exciton, the resulting quasiparticle is known as a plasmon-exciton polariton (PEP). To achieve a PEP in practice, because metal surfaces are the most common host for surface plasmons, light-absorbing molecules (referred to herein as simply "molecules"), such as dye molecules, are often placed near metal surfaces, or metal antennas. This type of plasmon-exciton polariton is known as a hybrid polariton, because the plasmon and exciton that form the polariton are hosted by separate materials.

SUMMARY

The illustrative embodiments provide a method, system, and computer program product. An embodiment includes a fabrication method that forms a ribbon of a thickness and a width, wherein a material of the ribbon is configured to host excitons as well as plasmons, and wherein the width is an inverse function of a wavector value at which an energy level of plasmons in the material substantially equals an energy level of excitons in the material, the substantially equal energies of the plasmons and the excitons in the ribbon causing an excitation of intrinsic plasmon-exciton polaritons (IPEPs) in the ribbon. The embodiment forms a first contact electrically coupled to a first location on the ribbon. The embodiment forms a second contact electrically coupled to a second location on the ribbon An embodiment includes a semiconductor fabrication system. The embodiment includes a processor, a computer-readable memory, and a computer-readable storage device, and program instructions stored on the storage device for execution by the processors via the memories, the stored program instructions causing the fabrication system to perform operations of the fabrication method.

An embodiment includes a semiconductor device. The semiconductor device includes structures formed according to the fabrication method.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
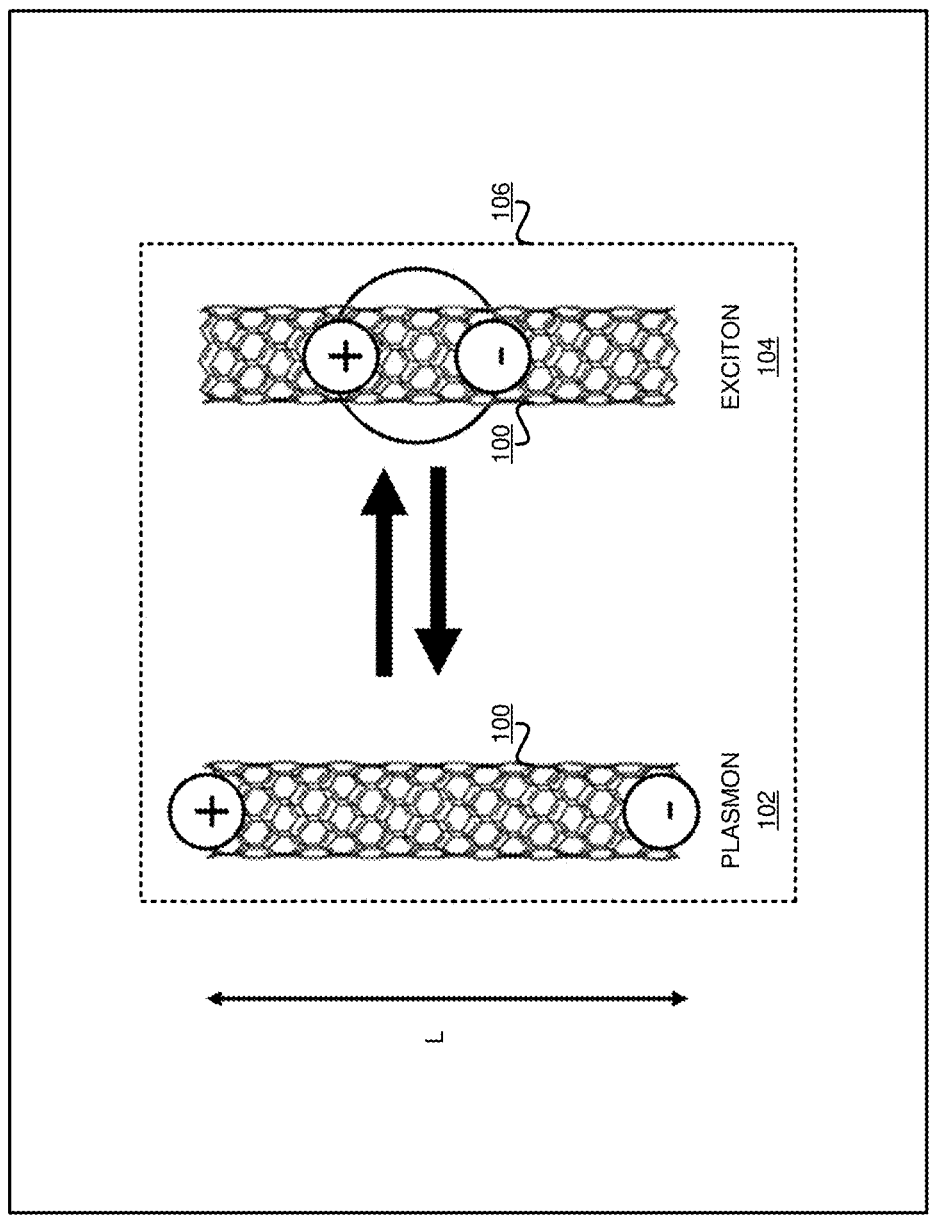
FIG. 1 depicts a schematic of the coupling of an exciton and a plasmon in a carbon nanotube, which is an exemplary material for IPEPs-based optoelectronics in accordance with an illustrative embodiment.

The illustrative embodiments provide an optoelectronic device that uses intrinsic PEP (IPEP). An intrinsic PEP is a polariton in which the plasmons and excitons, which are hybridized by close proximity to one another to form the polariton, are formed, sustained or exist in a single material. Recall that PEP, as they are formed in the prior-art, are hybrid PEPs, in which the plasmons and the excitons exist in different materials that are positioned in close proximity of one another.

Experimentation with the embodiments described herein has shown that intrinsic PEPs can be created in carbon nanotubes. Experimentation has also shown that the principle of forming intrinsic PEPs could also be readily extended to other nanomaterials, including GaAs nanowires, GaP nanowires, InP nanowires, metal oxide nanoparticles, and nanoribbons of two-dimensional transition metal dichalcogenides (TMDs). The general criteria for a material being able to host PEPs is that 1), it must host both surface plasmon resonances and excitons, 2) the free-charge density necessary for the material to host plasmon resonances cannot be so high that the excitons are quenched, and 3) the plasmons and excitons in this material must be dense enough and have strong enough optical activity so that the transition strengths between plasmons and excitons is stronger than any external radiative or nonradiative transitions.

The illustrative embodiments recognize that Plasmon-exciton polaritons, and particularly IPEPs, can incorporate several favorable properties of both excitons and plasmons. For example, 1. Like excitons, they can emit light. Optical emission rates can be enhanced by the plasmonic character of the polariton, and the resulting emitter can be brighter.

2. When the plasmon is confined to a resonator, the polariton can function as a nanoscale laser, in which the exciton acts as the gain medium.

3. Unlike hybrid exciton-plasmon polaritons, intrinsic exciton-plasmon polaritons have a nearly ideal overlap between the optical mode of the plasmon and the exciton, thereby producing a stronger coupling between the two excitations and enhancing polaritonic effects.

4. The exciton-plasmon resonator can also function as a photodetector, in which the presence of the plasmonic resonances effectively enhances the absorption rate of the material.

5. When a plasmonic medium is a semiconductor, its free-charge density can be tuned with an electrical gate, which tunes the frequency of the plasmon resonance. The emission and absorption frequency of the exciton-plasmon polariton can thereby be electrically tuned.

The illustrative embodiments used to describe the invention generally provide a method for creating IPEPs. The illustrative embodiments also provide a fabrication method for fabricating optoelectronic devices based on intrinsic plasmon-exciton polaritons.

An embodiment comprises a semiconductor device described herein. Another embodiment comprises a fabrication process for the contemplated semiconductor device and can be implemented as a software application. The software application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate optoelectronic devices based on intrinsic plasmon-exciton polaritons, as described herein.

For the clarity of the description, and without implying any limitation thereto, the illustrative embodiments are described using a specific type of material, to wit, carbon nanotube, in which to form the IPEPs. Within the scope of the illustrative embodiments, an embodiment can be implemented with a variety of similarly purposed materials, where such materials provide similar ability to form and sustain IPEPs and can be fabricated in a manner described herein.

Furthermore, simplified diagrams of the example structures, elements, and device(s) are used in the figures and the illustrative embodiments. In an actual fabrication of a proposed device, additional structures that are not shown or described herein, or structures different from those shown and described herein, may be present without departing the scope of the illustrative embodiments. Similarly, within the scope of the illustrative embodiments, a shown or described structure in the example device may be fabricated differently to yield a similar operation or result as described herein.

Differently shaded portions in the two-dimensional drawing of the example structures, layers, and formations are intended to represent different structures, layers, and formations in the example fabrication, as described herein. Similar materials may be shaded differently, and different materials may be shaded similarly for clarity of the depiction, and may be used as described in their corresponding descriptions. The different structures, layers, and formations may be fabricated using suitable materials that are known to those of ordinary skill in the art as belonging to the same class of materials described herein.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of optoelectronic devices in a similar manner, and such adaptations are contemplated within the scope of the illustrative embodiments. The specific contacts placements are also used only as non-limiting examples to describe certain options possible with the illustrative embodiments. Those of ordinary skill in the art will be able to use an embodiment to similarly provide electrical access to a layer or structure in a similar manner, and such usage is also contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A device of an embodiment described herein, comprises a substantial advancement of PEP optoelectronics. A manner of configuring and patterning a selected single material to cause IPEP formation as described herein is unavailable in the presently available methods. Thus, a substantial advancement of such devices or data processing systems by executing a method of an embodiment is in an improved optoelectronic device and a fabrication process for fabricating the improved optoelectronic devices which create and utilize IPEPs.

The illustrative embodiments are described with respect to certain types of devices, electrical properties, structures, formations, layers, orientations, directions, steps, operations, planes, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

The examples in this disclosure are used only for the clarity of the description and are not limiting to the illustrative embodiments. Additional structures, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

A substrate contemplated within the scope of the illustrative embodiments can be formed using any suitable substrate material, such as, for example, monocrystalline Silicon (Si), Silicon-Germanium (SiGe), Silicon-Carbon (SiC), compound semiconductors obtained by combining group III elements from the periodic table (e.g., Al, Ga, In) with group V elements from the periodic table (e.g., N, P, As, Sb) (III-V compound semiconductor), compounds obtained by combining a metal from either group 2 or 12 of the periodic table and a nonmetal from group 16 (the chalcogens, formerly called group VI) (II-VI compound semiconductor), or semiconductor-on-insulator (SOI). In some embodiments of the invention, the substrate includes a buried oxide layer (not depicted).

Contacts as described herein are electrically conducting metallic contacts. A metal contact can be formed or filled using, but is not limited to, tungsten (W), aluminum (Al), or copper (Cu), cobalt (Co), which can further include a barrier layer. The barrier layer can be, but is not limited to, titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with the top source drain material, and/or anode/cathode material. In various embodiments, the barrier layer can be conformally deposited in the trench(es) by ALD, CVD, MOCVD, PECVD, or combinations thereof. In various embodiments, the metal fill can be formed by ALD, CVD, and/or PVD to form the electrical contacts.

A mask can be used for patterning, etching, recessing, and many other purposes. A mask contemplated herein can be a photoresist mask or a sacrificial hard mask.

With reference to FIG. 1, this figure depicts a schematic of the coupling of an exciton and a plasmon in a carbon nanotube, which is an exemplary material for IPEPs-based optoelectronics in accordance with an illustrative embodiment. In carbon nanotube 100, plasmon 102 is a charge oscillation coupled to an optical field. Exciton 104 is a bound state comprising an electron and an electron hole in carbon nanotube 100. Carbon nanotube 100, when etched in a ribbon of width L provides a strong coupling environment in which plasmon 102 and exciton 104 hybridize to form IPEP 106 described herein. IPEP 106 has properties of both uncoupled excitations, i.e., of plasmon 102 and exciton 104.

For IPEP 106 to form and maintain in carbon nanotube 100, length L—which is the width of a ribbon of densely packed plurality of carbon nanotubes 100—is a critical factor. Greater than a threshold density of carbon nanotubes 100 in the ribbon of width L is another significant factor in forming and maintaining IPEP 106 in carbon nanotube 100. Preferably, a film with a density greater than $1*10^5$ nanotubes/micrometer$^2$ is sufficient for the IPEP phenomenon, although a greater density does increase the performance. An experimentation with an embodiment used two-dimensional nanotube density of $4*10^5$ nanotubes/micrometer$^2$. Generally, in order for the excitons not to be quenched by free charges, the free charge density in PEP devices must not be too high. This low charge density causes the plasmon resonance to have a low energy. However, increasing the packing density of the carbon nanotubes effectively increases the charge density of the film and thus causes the plasmon resonances to have higher energies without quenching the excitons. For the purposes of the illustrative embodiments, high plasmon resonance is desirable so that the plasmon resonance energy level substantially equals the exciton energy level. Moreover, all other factors being equal, the coupling strength between plasmons and excitons will scale as the square root of the nanotube packing density. Therefore, when carbon nanotubes are more densely packed in the ribbon, the coupling strength between plasmons and excitons will be stronger.

In a photodetector type optoelectronic device formed using IPEPs 106 in carbon nanotubes 100, IPEPs 106 detect a suitable electromagnetic wavelength or range of wavelengths, for example, including but not limited to visible light, by developing a potential difference across a pair of contacts (not shown). In a photoemitter type optoelectronic device formed using the IPEPs 106 in carbon nanotubes 100, IPEPs 106 emit a suitable electromagnetic wavelength or range of wavelengths, for example, including but not limited to visible light, when a potential difference is applied across a pair of contacts (not shown).

Figure 2:
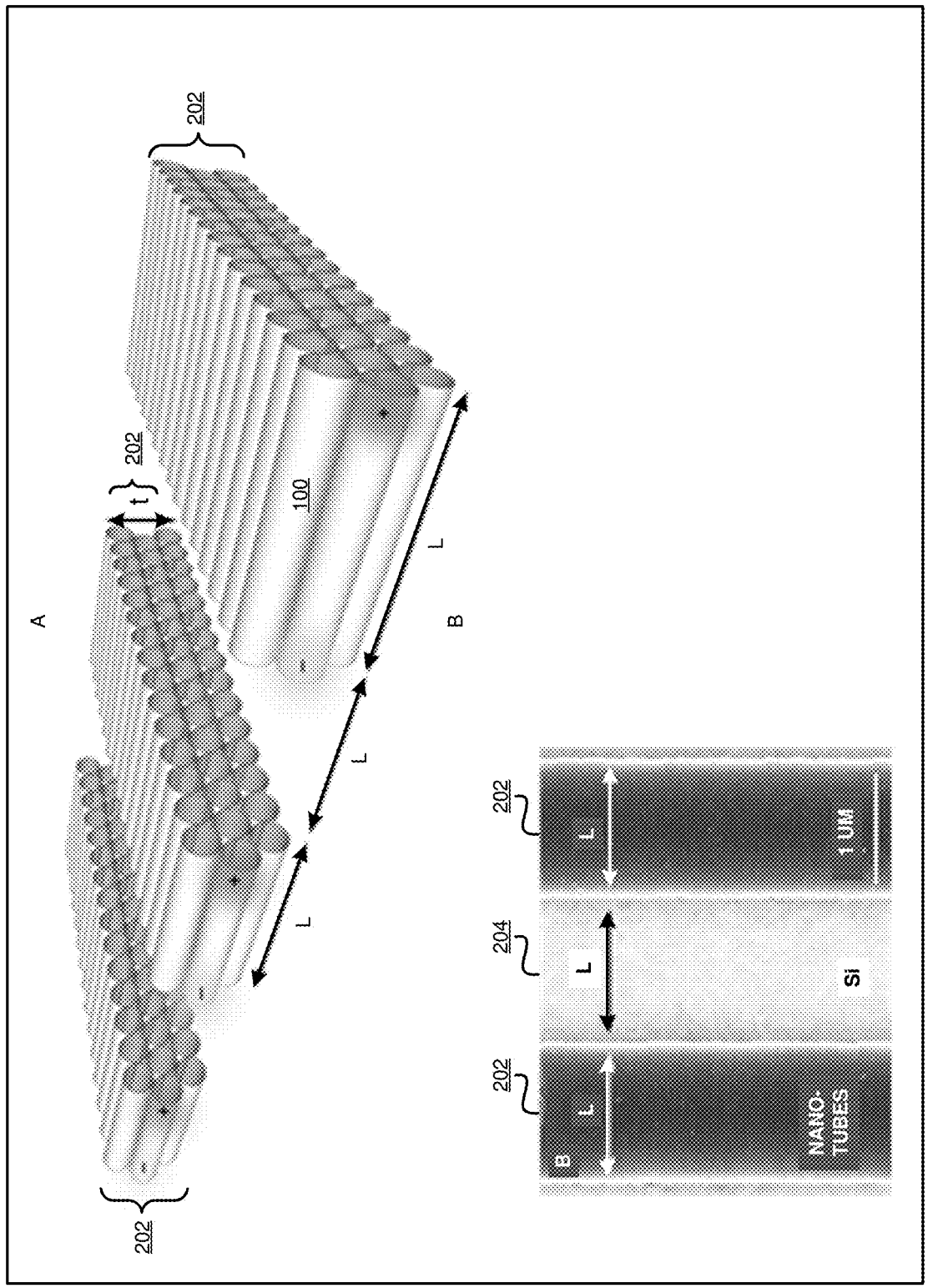
FIG. 2 depicts an illustration of a crystallized carbon-nanotube film that is etched into nanoribbons to function as plasmon resonators in accordance with an illustrative embodiment.

With reference to FIG. 2, this figure depicts an illustration of a crystallized carbon-nanotube film that is etched into nanoribbons to function as plasmon resonators in accordance with an illustrative embodiment. As shown in view A, ribbon 202 comprises a plurality of densely packed carbon nanotubes 100 as shown in FIG. 1. Ribbon 202 has thickness "t" and width L as described in FIG. 1.

As an example, a film of crystallized carbon nanotubes can be deposited over a substrate, e.g., substrate 204 visible in view B, which is a scanning electron micrograph of nanoribbons etched into a carbon nanotube film. The carbon nanotube film has the requisite density of carbon nanotubes, and is of thickness t=200 nm. A suitable etching process etches the carbon nanotube film into ribbons 202 of the computed width L, which in this example is computed to be approximately 1 micrometer (μm). When ribbons 202 are formed, areas from where the carbon nanotube film has been etched away might expose substrate 204, as shown in view B.

Figure 3:
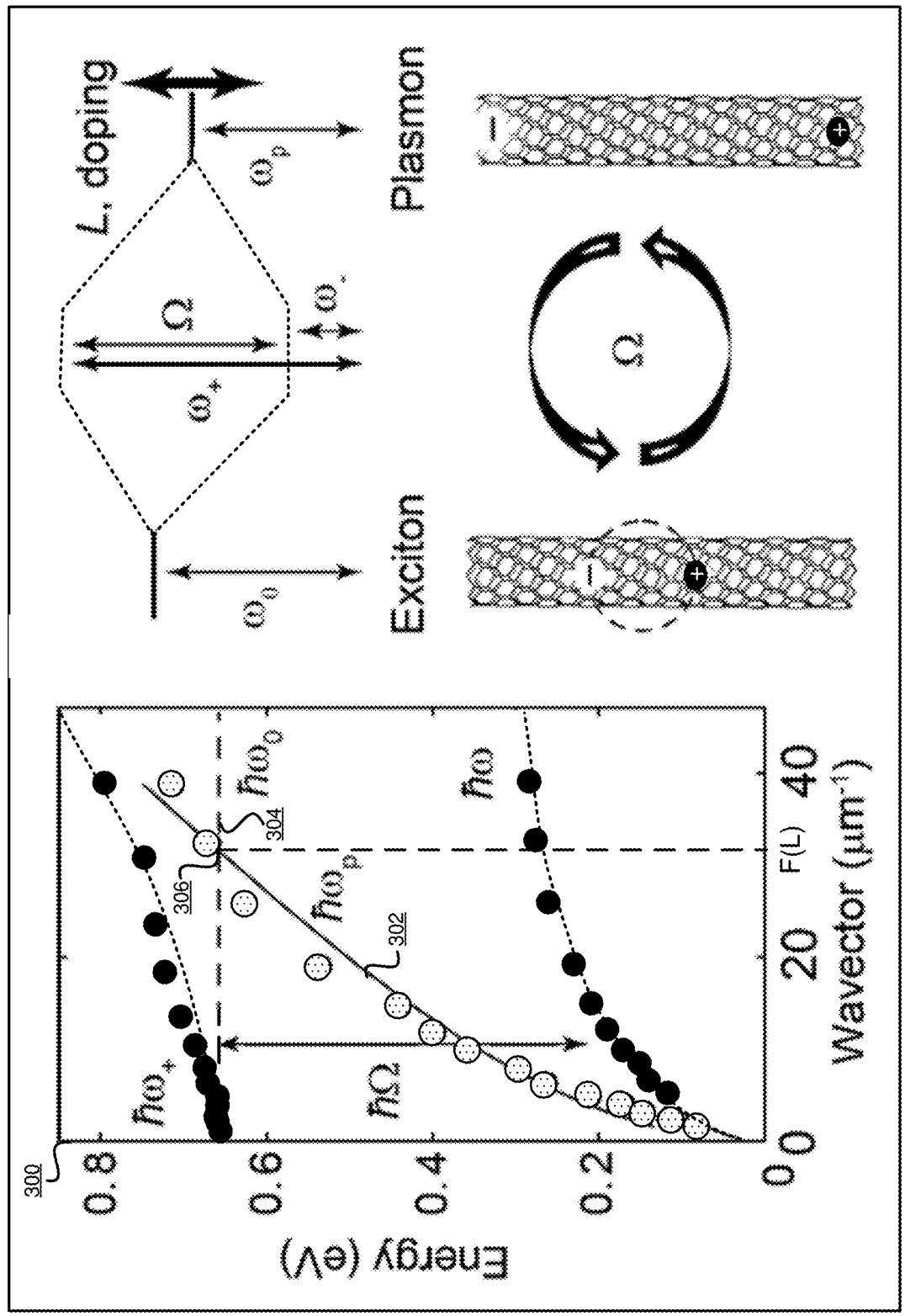
FIG. 3 depicts a graphical representation of a method for determining L in accordance with an illustrative embodiment.

With reference to FIG. 3, this figure depicts a graphical representation of a method for determining L in accordance with an illustrative embodiment. The value of L determined using the method depicted in this figure is usable for etching ribbon 202 in FIG. 2.

Graph 300 plots experimentation data depicting the position of the absorption peaks in the nanoribbons of crystallized nanotube films according to one embodiment. The wavector (q), on the x-axis, is an inverse function (f) of L and is defined as f(L). In one embodiment, the fundamental plasmon resonance is considered and f(L) is $\pi/L$.

The white markers (graph points depicted as white circles) represent the absorption of the film in a high carrier concentration state, where there is only plasmon resonance, and excitons are quenched. Plasmon energy is $\omega_p$ and is plotted as graph 302. The black markers (graph points depicted as black circles) are in a low carrier concentration state, where excitons and plasmons hybridize to make exciton-plasmon polaritons (whose frequency is $\omega_+$ and $\omega_-$). The two polariton branches are split by the Rabi frequency ($\Omega$). The bare exciton energy is $\omega_0$ and is plotted as graph 304.

Point 306 is the point of intersection of graphs 302 and 304 for a given single material, here carbon nanotubes. At point 306, the energy level of the plasmons resonance and the energy levels of the excitons are substantially equal to form stable IPEPs. The value of wavector on the x-axis at point 306 is f(L), from which L can be computed for point 306 according to the inverse function f.

Figure 4:
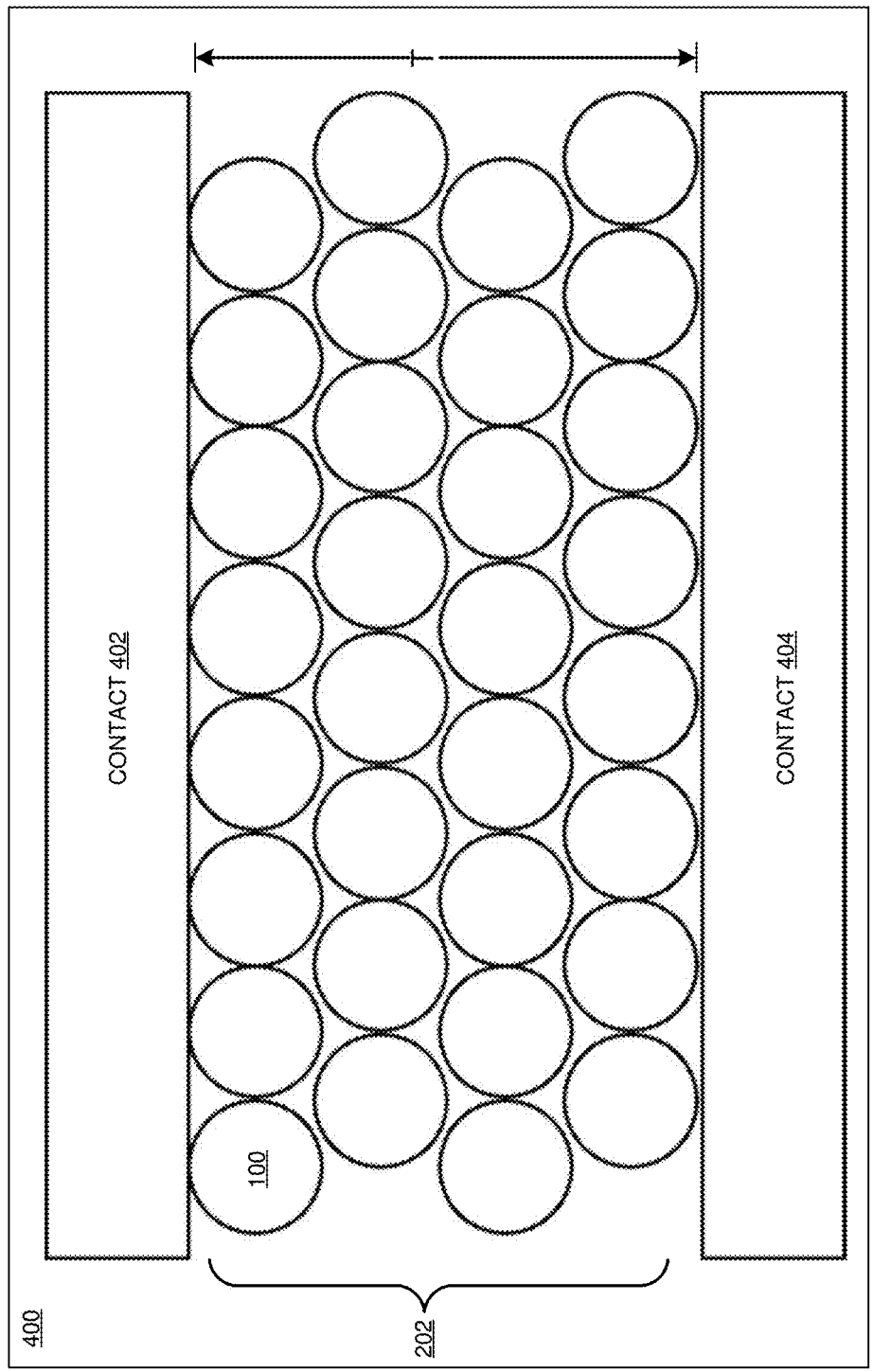
FIG. 4 depicts a block diagram of one example manner of fabricating an IPEPs-based optoelectronic device in accordance with an illustrative embodiment.

With reference to FIG. 4, this figure depicts a block diagram of one example manner of fabricating an IPEPs-based optoelectronic device in accordance with an illustrative embodiment. View 400 is an elevation view of a simplified representation of an IPEPs-based photodiode (device).

The device in view 400 comprises contacts 402 and 404, which are formed using a suitable metal or other material. Contacts 402 and 404 are electrically coupled to ribbon 202, which is of thickness "t" and width L (not visible in this view), and is formed using a plurality of carbon nanotubes 100, as described herein. The device in view 400 can be connected to an external circuit using contacts 402 and 404.

Figure 5:
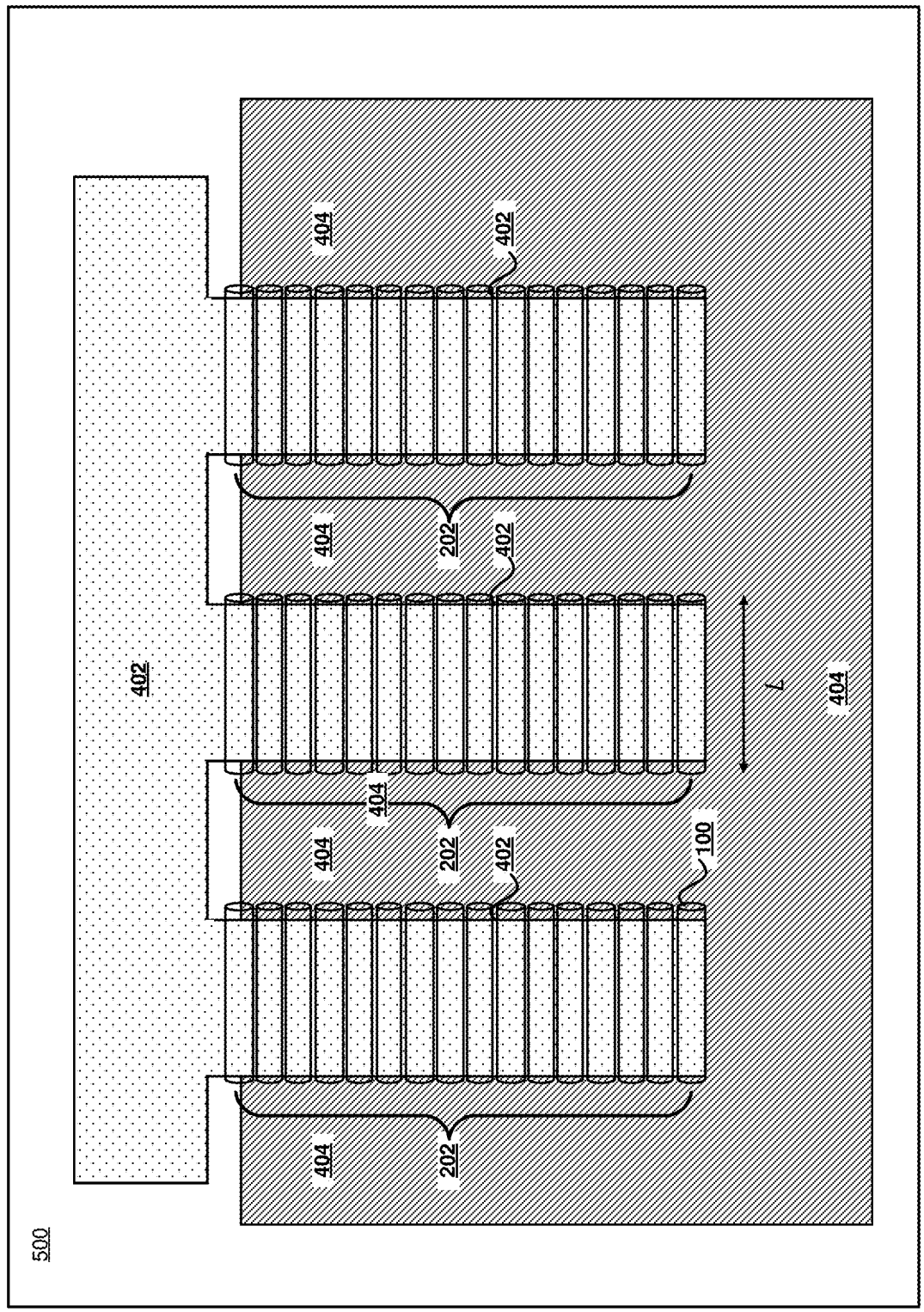
FIG. 5 depicts a block diagram of another view of the IPEPs-based optoelectronic device in accordance with an illustrative embodiment.

With reference to FIG. 5, this figure depicts a block diagram of another view of the IPEPs-based optoelectronic device in accordance with an illustrative embodiment. View 500 is a plan view of the example IPEPs-based photodiode depicted and described with respect to FIG. 4. In this example implementation, view 500 shows ribbon 202 of width L sandwiched between contacts 402 and 404. Any number of ribbons 202 can be fabricated in this manner. An embodiment causes the fabrication of one or both of contacts 402 and 404 such that contacts 402-404 cover the surface area of ribbon 202 either partially or completely depending upon the materials used for contacts 402-404.

For example, if the material for contacts 402 and 404 is transparent or partially transparent to light or implementation-specific electromagnetic wavelengths, the light-facing contact from contacts 402-404, e.g., contact 402, can be formed to cover up to the entirety of the surface area on the side of ribbon 202 facing contact 402. Contact 404 can be formed using the same or different material as contact 402.

On the other hand, if the material for light-facing contact 402 is insufficiently transparent or completely opaque to light or implementation-specific electromagnetic wavelengths, contact 402 may be formed to only minimally cover up the surface area on the side of ribbon 202 that is exposed to light.

Figure 6:
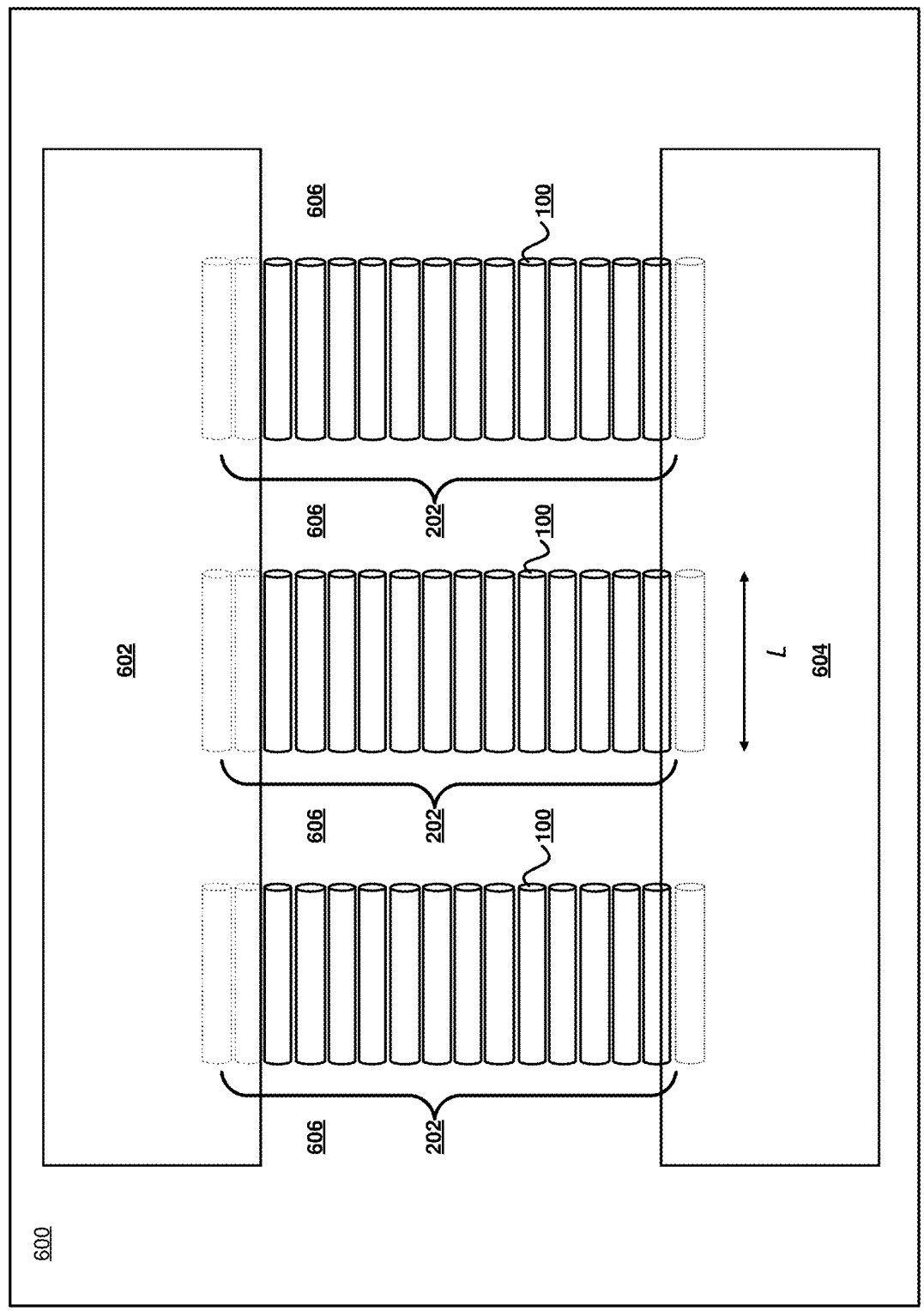
FIG. 6 depicts a block diagram of another example manner of fabricating an IPEPs-based optoelectronic device in accordance with an illustrative embodiment.

With reference to FIG. 6, this figure depicts a block diagram of another example manner of fabricating an IPEPs-based optoelectronic device in accordance with an illustrative embodiment. View 600 is a plan view of an example IPEPs-based photodiode formed using contact 602, contact 604, and any number of ribbons 202. Contacts 602 and 604 are functionally similar to contacts 402 and 404, but may be formed using different materials, and are situated differently from contacts 402-404 as shown in FIG. 6.

In this implementation, unlike the implementation in FIGS. 4-5, contacts 602-604 are electrically coupled to ribbon 202 of nanotube plasmon-exciton resonators, and are placed laterally (i.e. along the width of ribbon 202), instead of on the top and bottom of ribbon 202. The lateral placement may optionally extend partially over the surface of ribbon 202 to improve the reliability of the electrical contact with ribbon 202.

This implementation allows the fabrication to place substantially no contact material on the light-incident surface of ribbon 202, which could partially reflect and absorb light that is incident on the structure. Unless suitable preventative measures are taken, this implementation may allow heat from the absorbed light to flow into substrate 606 and be wasted, instead of flowing into contacts 602-604 where it is measurable as photothermoelectric current.

Figure 7:
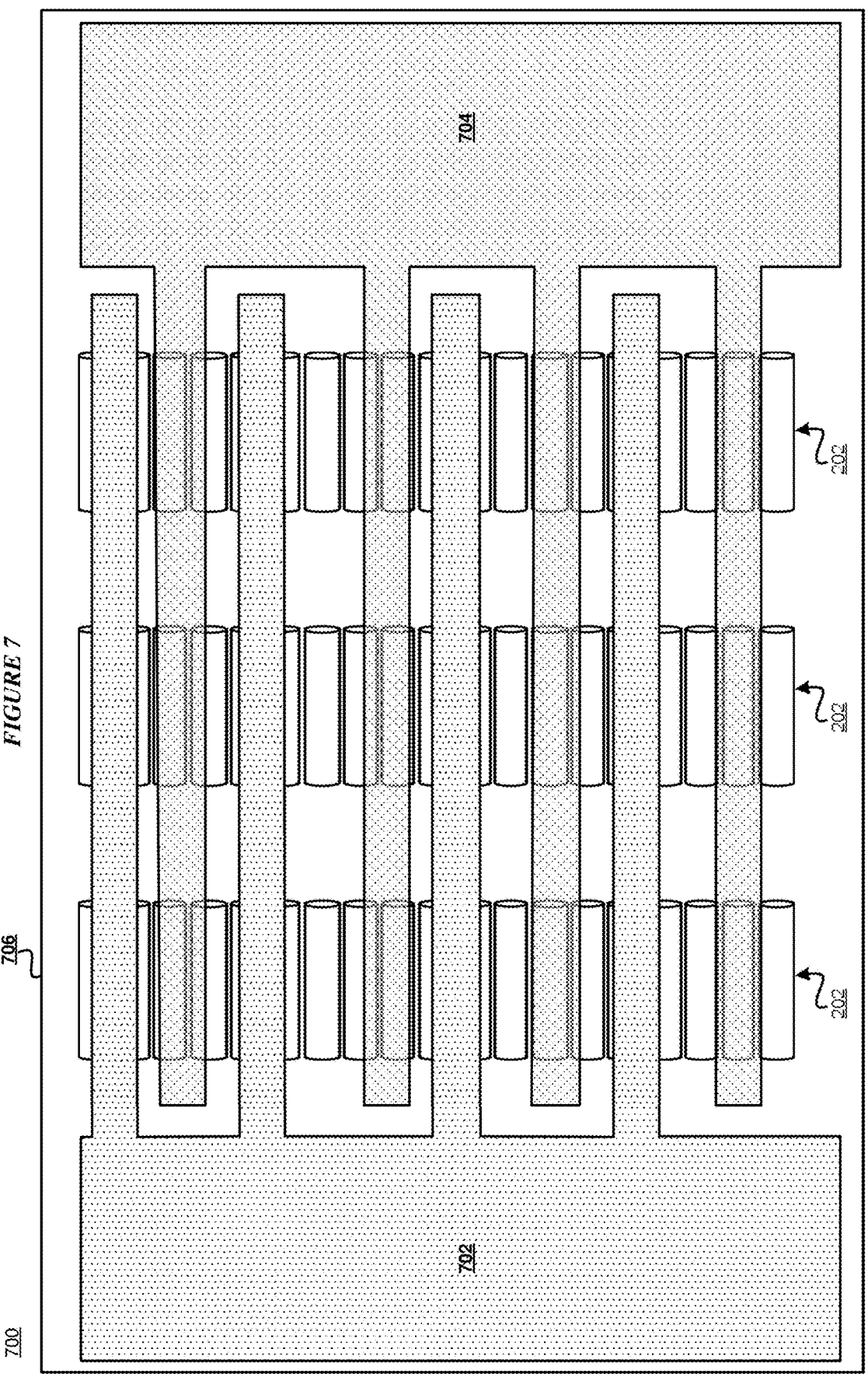
FIG. 7 depicts a block diagram of another example manner of fabricating an IPEPs-based optoelectronic device in accordance with an illustrative embodiment.

With reference to FIG. 7, this figure depicts a block diagram of another example manner of fabricating an IPEPs-based optoelectronic device in accordance with an illustrative embodiment. View 700 is a plan view of another example IPEPs-based photodiode formed using contact 702, contact 704, and any number of ribbons 202. Contacts 602 and 604 are functionally similar to contacts 402 and 404, or contacts 602 and 604, but may be formed using different materials, and are situated differently from contacts 402-404 or 602-604, as shown in FIG. 7.

In this implementation, unlike the implementation in FIGS. 4-5-6, contacts 702-704 are electrically coupled to ribbon 202 of nanotube plasmon-exciton resonators, and are placed laterally but interdigitated. I.e., contacts 702 and 704 are both formed on the light-incident surface of ribbon 202 but at a sufficient insulating distance from one another. Any number of finger-like protrusions for each contact 702 or 704 can be formed in this manner, and the number of protrusions need not be equal for contacts 702 and 704. Furthermore, the protrusions need not alternate one for one.

For example, one protrusion of contact 704 may follow zero, one, two, or more protrusions of contact 702, and vice-versa.

This implementation allows the fabrication to place higher spatial frequency of the contacts to collect the signal from the photodiodes more efficiently. The materials used for contacts 702 and 704 are same in one embodiment, and different from one another in another embodiment. In one embodiment, the materials used for contacts 702 and 704 are at least partially transparent to allow electromagnetic radiation of a desired wavelength to reach ribbon 202. In one embodiment, a suitable thermal insulator may be formed between substrate 706 and ribbon 202 to mitigate heat loss from ribbon 202 to substrate 706.

Figure 8:
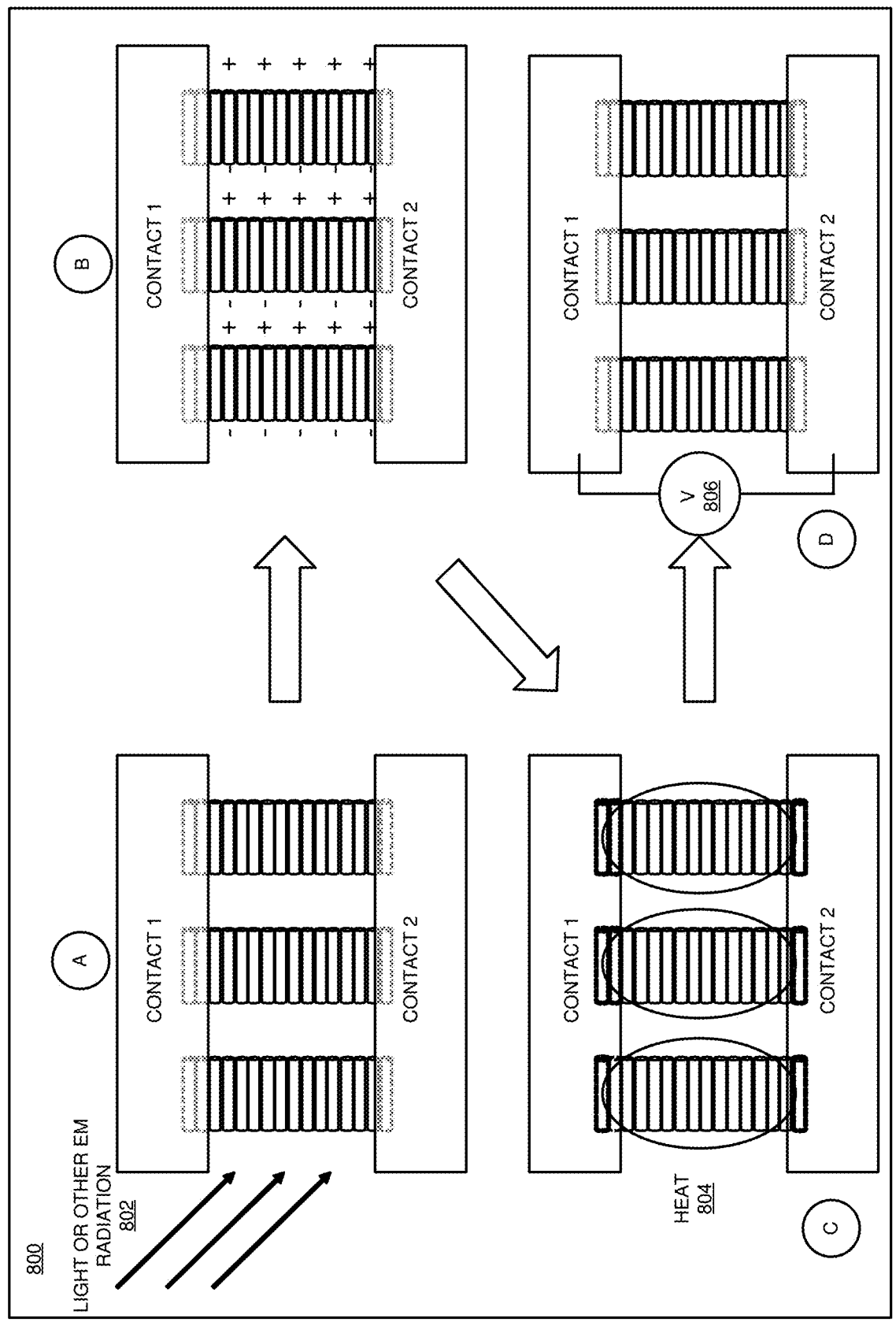
FIG. 8 depicts a sequence of block diagrams illustrating an example operation of a photodetector type IPEPs-based optoelectronic device in accordance with an illustrative embodiment.

With reference to FIG. 8, this figure depicts a sequence of block diagrams illustrating an example operation of a photodetector type IPEPs-based optoelectronic device in accordance with an illustrative embodiment. Operation 800 is depicted in four broad steps—A, B, C, and D, and is performed using an IPEPs-based optoelectronic device fabricated in a manner described herein. The device used in operation 800 comprises one or more ribbon 202, contact 1—which corresponds to any of contacts 402, 602, or 702, and contact 2—which corresponds to any of contacts 404, 604, or 704, respectively.

In step A, visible light or another electromagnetic radiation of a suitable wavelength is made incident upon the device. In step B, the incident radiation excites plasmon-exciton polaritons in ribbon 202. In step C, the plasmon-exciton polaritons decay into heat 804. In step D, heat 804 can be observed as potential difference 806 (V) at contact 1 and contact 2 due to the photothermoelectric effect.

Figure 9:
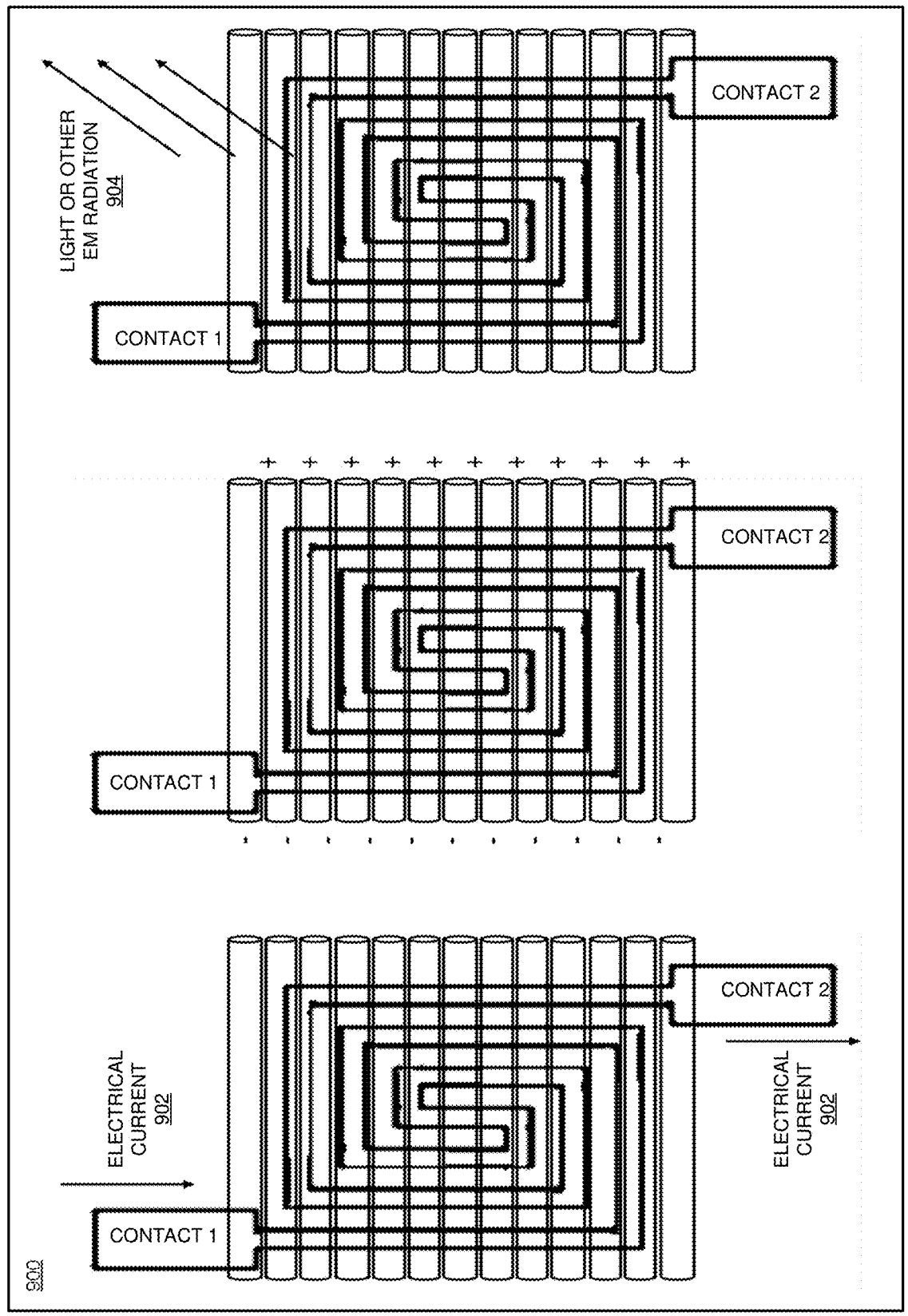
FIG. 9 depicts a sequence of block diagrams illustrating an example operation of a photoemitter type IPEPs-based optoelectronic device in accordance with an illustrative embodiment.

With reference to FIG. 9, this figure depicts a sequence of block diagrams illustrating an example operation of a photoemitter type IPEPs-based optoelectronic device in accordance with an illustrative embodiment. Operation 900 is depicted in three broad steps—A, B, and C, and is performed using an IPEPs-based optoelectronic device fabricated in a manner described herein. The device used in operation 900 comprises one or more ribbon 202, contact 1—which corresponds to any of contacts 402, 602, or 702, contact 2—which corresponds to any of contacts 404, 604, or 704, respectively, and a heating element coupled to contact 1 and contact 2 to form a microheater.

In step A, electric current 902 is passed through a microheater formed using contact 1 and contact 2. The microheater produces heat from the passage of electric current 902 and applies or transfers the heat to ribbon 202. In step B, the heat excites IPEPs in ribbon 202. In step C, the IPEPs in ribbon 202 decay into photons to output visible light or another electromagnetic radiation 904 of a suitable wavelength due to the photothermoelectric effect.

Figure 10:
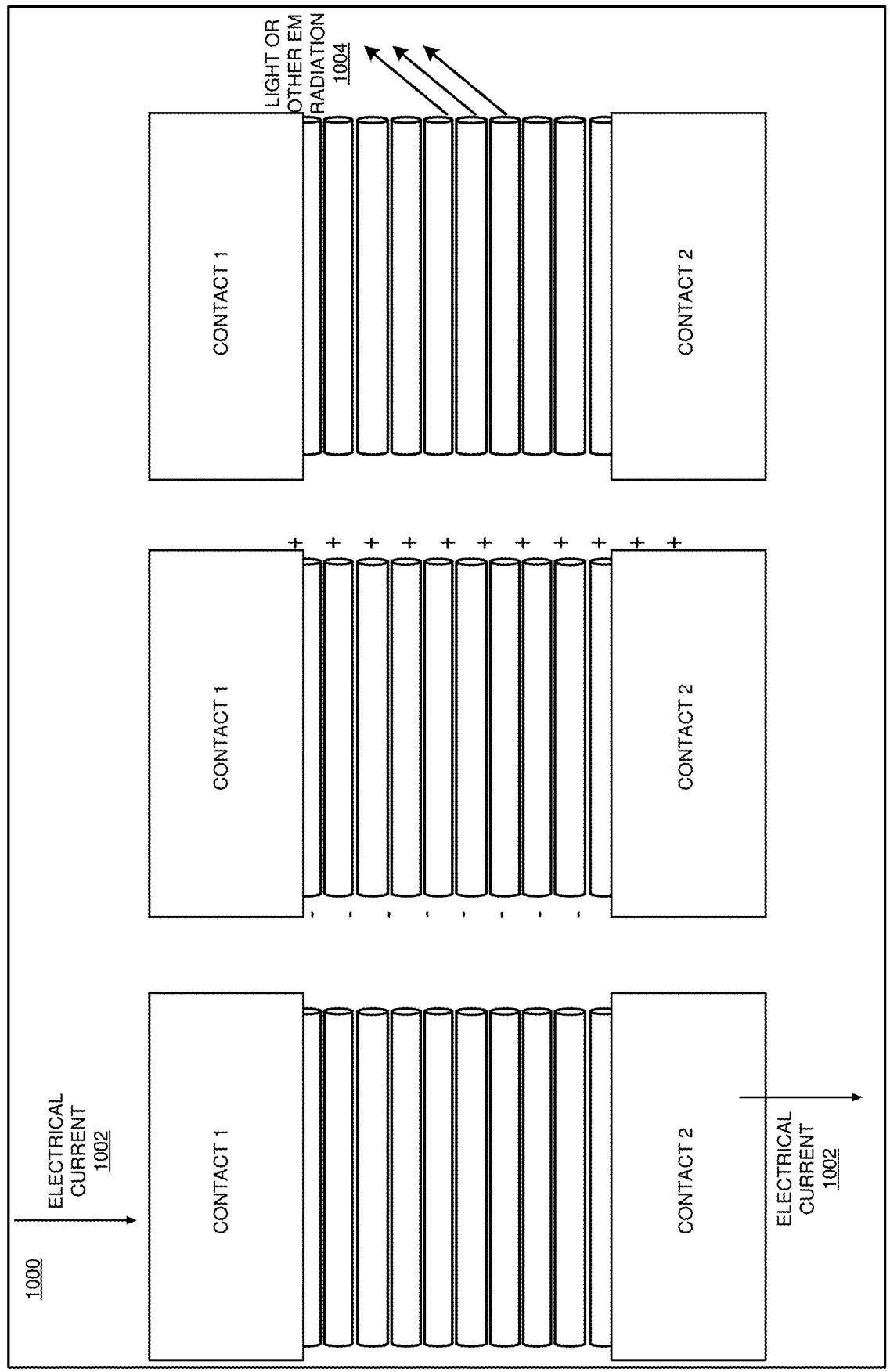
FIG. 10 depicts a sequence of block diagrams illustrating an example operation of another photoemitter type IPEPs-based optoelectronic device in accordance with an illustrative embodiment.

With reference to FIG. 10, this figure depicts a sequence of block diagrams illustrating an example operation of another photoemitter type IPEPs-based optoelectronic device in accordance with an illustrative embodiment. Operation 1000 is depicted in three broad steps—A, B, and C, and is performed using an IPEPs-based optoelectronic device fabricated in a manner described herein. The device used in operation 1000 comprises one or more ribbon 202, contact 1—which corresponds to any of contacts 402, 602, or 702, and contact 2—which corresponds to any of contacts 404, 604, or 704, respectively.

In step A, electric current 1002 is passed directly through ribbon 202. In step B, the passage of current 1002 through ribbon 202 excites IPEPs in ribbon 202. In step C, the IPEPs in ribbon 202 decay into photons to output visible light or another electromagnetic radiation 1004 of a suitable wavelength due to the photothermoelectric effect.

Figure 11:
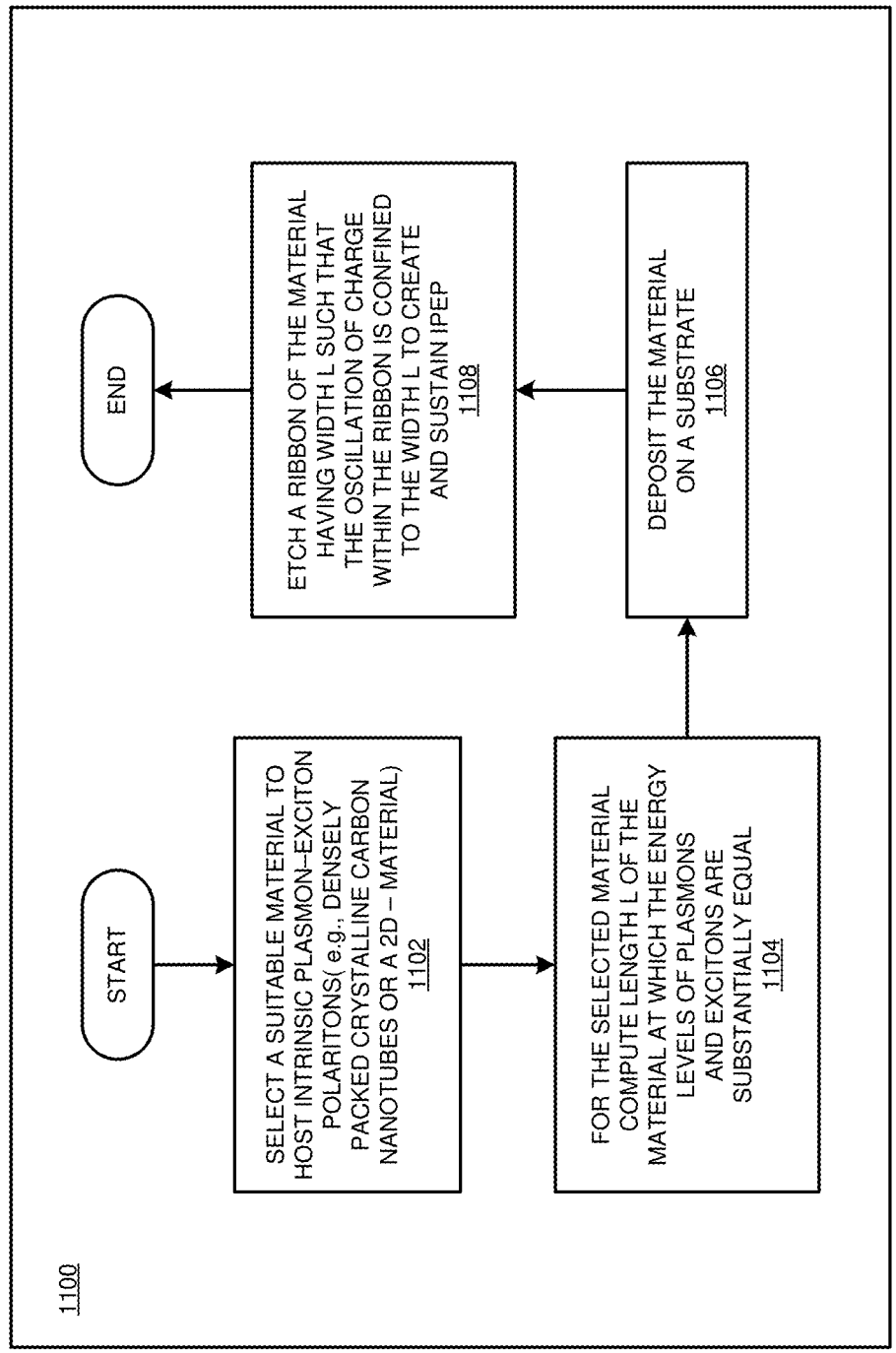
FIG. 11 depicts a flowchart of an example process for fabricating an IPEPs-based optoelectronic device in accordance with an illustrative embodiment.

With reference to FIG. 11, this figure depicts a flowchart of an example process for fabricating an IPEPs-based optoelectronic device in accordance with an illustrative embodiment. Process 1100 can be implemented in a software application or a fabrication system to operate the fabrication system to perform the steps described herein.

An embodiment implementing process 1100 selects a suitable material that can host IPEPs, such as, but not limited to a film of thickness "t" comprising densely packed carbon nanotubes (block 1102). The embodiment computes a length L of the material at which the energy level of plasmons in the material substantially equals the energy level of excitons (block 1104). The embodiment deposits the material on a substrate, such as silicon, but not limited thereto (block 1106). The embodiment etches the material film into a ribbon such that the ribbon has a width L (block 1108). The embodiment ends process 1100 thereafter.

Figure 12:
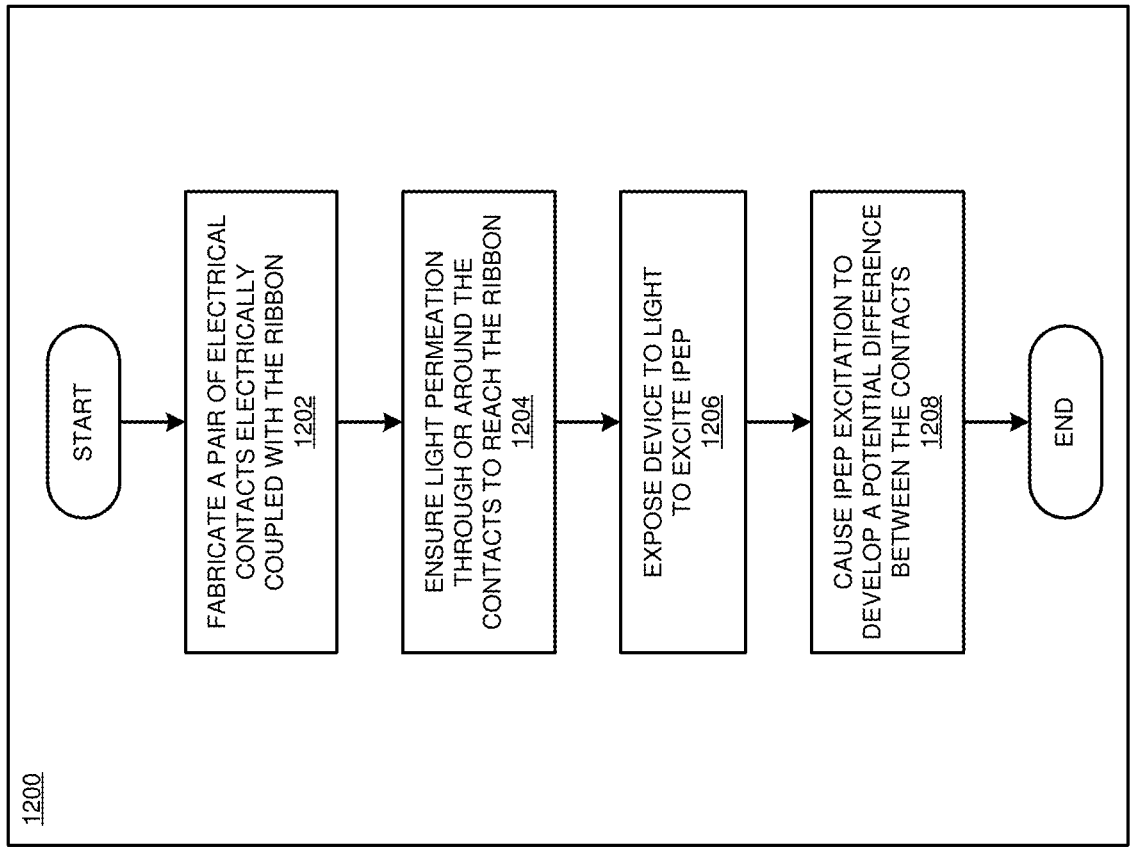
FIG. 12 depicts a flowchart of another example process for fabricating and operating an IPEPs-based optoelectronic device in accordance with an illustrative embodiment.

With reference to FIG. 12, this figure depicts a flowchart of another example process for fabricating and operating an IPEPs-based optoelectronic device in accordance with an illustrative embodiment. Process 1200 can be implemented in a software application or a fabrication system to operate the fabrication system to perform the steps described herein.

An embodiment implementing process 1200 causes a fabrication system to fabricate a pair of contacts in electrical coupling with the ribbon formed in process 1100 (block 1202). The embodiment ensures that light or a suitable electromagnetic radiation can permeate through or around the contacts to reach the ribbon (block 1202).

The embodiment exposes the device comprising the ribbon and the contacts to light or suitable radiation to excite the IPEPs in the ribbon (block 1206). The embodiment causes the excited IPEPs to decay and develop a potential difference across the contacts (block 1208). The embodiment ends process 1200 thereafter.

Figure 13:
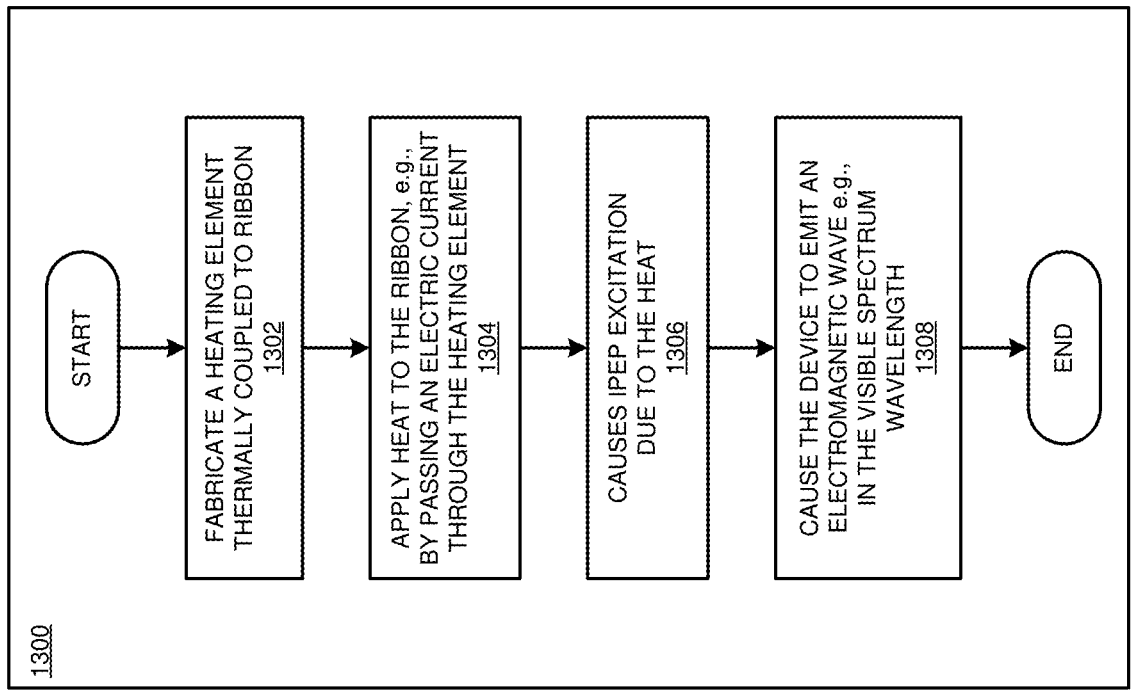
FIG. 13 depicts a flowchart of another process of fabricating and operating an IPEPs-based optoelectronic device in accordance with an illustrative embodiment.

With reference to FIG. 13, this figure depicts a flowchart of another process of fabricating and operating an IPEPs-based optoelectronic device in accordance with an illustrative embodiment. Process 1300 can be implemented in a software application or a fabrication system to operate the fabrication system to perform the steps described herein.

An embodiment implementing process 1300 causes the fabrication system to fabricate a heating element that is thermally coupled to the ribbon formed in process 1100 (block 1302). The embodiment applies heat to the ribbon by passing an electric current through the heating element (block 1304). The embodiment excites the IPEPs in the ribbon due to the applied thermal energy (block 1306). The embodiment causes the IPEPs to decay into photons, thereby causing the device to emit light or electromagnetic radiation of other wavelength (block 1308). The embodiment ends process 1300 thereafter.

While certain steps and processes are described with certain structures, it is to be understood that the steps and/or processes can be adapted to fabricate any of the structure variations described herein within the scope of the illustrative embodiments. While certain materials are used in multiple layers or structures, it is to be understood that substitute materials or different but functionally equivalent materials can be used in place of the described materials at any layers described herein within the scope of the illustrative embodiments. While certain fabrication methods have been used at certain steps, it is to be understood that a fabrication method may be omitted, added, or modified at a described step to achieve functionally similar result from the semiconductor structure within the scope of the illustrative embodiments. While certain operations are described as a "step", several operations can be combined together to form a single fabrication step in a process described herein. While certain orientations have been referred to as "top" and "bottom" with reference to an example vertical orientation of the proposed device, it is to be understood that the device can be reoriented laterally such that the top and bottom become left/right or right/left, or bottom and top, or front/back or back/front, as the reorientation case may be.

Thus, a semiconductor device, fabrication method therefor, and a fabrication system or apparatus therefor using a software implementation of the method, are provided in the illustrative embodiments for optoelectronic devices based on intrinsic plasmon-exciton polaritons and other related features, functions, or operations. Where an embodiment or a portion thereof is described with respect to a type of semiconductor device, the fabrication method, system or apparatus, the software implementation, or a portion thereof, are adaptable or configurable for use with a different manifestation of that type of device.

The present invention may be a semiconductor device, system, a method, and/or a computer program product at any possible technical detail level of integration. The computer program product may include a computer readable storage medium (or media) having computer readable program instructions thereon for causing a processor to carry out aspects of the present invention. A computer readable storage medium, including but not limited to computer-readable storage devices as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network.

What is claimed is:

1. A semiconductor device comprising:
   a ribbon of a thickness and a width, wherein a material of the ribbon is configured to host excitons as well as plasmons, and wherein the width is an inverse function of a wavector value at which an energy level of plasmons in the material substantially equals an energy level of excitons in the material, the substantially equal energies of the plasmons and the excitons in the ribbon causing an excitation of intrinsic plasmon-exciton polaritons (IPEPs) in the ribbon;
   a first contact electrically coupled to a first location on the ribbon; and
   a second contact electrically coupled to a second location on the ribbon.

2. The semiconductor device of claim 1, wherein the ribbon of the width is etched from a film of the material deposited on a substrate.

3. The semiconductor device of claim 1,
   wherein the device is an IPEP-based optoelectronic device of a photodetector type,
   wherein the ribbon receives an electromagnetic radiation of a frequency,
   wherein the electromagnetic radiation causes the excitation of IPEPs in the ribbon, and
   wherein the IPEPs decay to produce a potential difference between the first contact and the second contact.

4. The semiconductor device of claim 3, wherein the electromagnetic radiation of the frequency comprises light of a frequency in a visible range of an electromagnetic frequency spectrum.

5. The semiconductor device of claim 1,
   wherein the device is an IPEP-based optoelectronic device of a photoemitter type,
   wherein an electric current is passed through from the first contact to the second contact,
   wherein the electric current causes the excitation of IPEPs in the ribbon, and
   wherein the IPEPs decay to produce the ribbon receives an electromagnetic radiation of a frequency.

6. The semiconductor device of claim 5,
   wherein the electric current is passed directly through the ribbon to cause the excitation of the IPEPs in the ribbon.

7. The semiconductor device of claim 5, further comprising:
   a heating element, wherein the heating element is electrically coupled to the first contact and the second contact, wherein the heating element is thermally coupled to the ribbon, and
   wherein the electric current is passed through the heating element to transfer heat to the ribbon, the heat causing the excitation of the IPEPs in the ribbon.

8. The semiconductor device of claim 1, wherein the first location and the second location are situated widthwise on opposite ends of the ribbon.

9. The semiconductor device of claim 1, wherein the first location comprises a lengthwise area of the ribbon.

10. The semiconductor device of claim 1, wherein the first location and the second location are situated lengthwise on a side of the ribbon that receives an electromagnetic radiation of a frequency.

11. The semiconductor device of claim 1, wherein the first location on the ribbon avoids obstructing an electromagnetic radiation of a frequency from reaching the ribbon.

12. The semiconductor device of claim 1, wherein the first contact is formed using a first material that is at least partially transparent to an electromagnetic radiation of a frequency.

13. The semiconductor device of claim 1, wherein the material of the ribbon comprises a plurality of carbon nanotubes such that the plurality of carbon nanotubes achieves a specified density in the ribbon.

14. The semiconductor device of claim 1, wherein the material of the ribbon comprises a two-dimensional material (2D-material).

15. A semiconductor fabrication system comprising a processor, a computer-readable memory, and a computer-readable storage device, and program instructions stored on the storage device for execution by the processors via the memories, the stored program instructions causing the fabrication system to perform operations comprising:
   forming a ribbon of a thickness and a width, wherein a material of the ribbon is configured to host excitons as well as plasmons, and wherein the width is an inverse function of a wavector value at which an energy level of plasmons in the material substantially equals an energy level of excitons in the material, the substantially equal energies of the plasmons and the excitons in the ribbon causing an excitation of intrinsic plasmon-exciton polaritons (IPEPs) in the ribbon;

forming a first contact electrically coupled to a first location on the ribbon; and forming a second contact electrically coupled to a second location on the ribbon.

16. The semiconductor fabrication system of claim 15, wherein the ribbon of the width is etched from a film of the material deposited on a substrate.

17. The semiconductor fabrication system of claim 15,
wherein the device is an IPEP-based optoelectronic device of a photodetector type,
wherein the ribbon receives an electromagnetic radiation of a frequency,
wherein the electromagnetic radiation causes the excitation of IPEPs in the ribbon, and
wherein the IPEPs decay to produce a potential difference between the first contact and the second contact.

18. The semiconductor fabrication system of claim 17,
wherein the electromagnetic radiation of the frequency comprises light of a frequency in a visible range of an electromagnetic frequency spectrum.

19. The semiconductor fabrication system of claim 15,
wherein the device is an IPEP-based optoelectronic device of a photoemitter type,
wherein an electric current is passed through from the first contact to the second contact,
wherein the electric current causes the excitation of IPEPs in the ribbon, and
wherein the IPEPs decay to produce the ribbon receives an electromagnetic radiation of a frequency.

20. A method comprising:
forming a ribbon of a thickness and a width, wherein a material of the ribbon is configured to host excitons as well as plasmons, and wherein the width is an inverse function of a wavector value at which an energy level of plasmons in the material substantially equals an energy level of excitons in the material, the substantially equal energies of the plasmons and the excitons in the ribbon causing an excitation of intrinsic plasmon-exciton polaritons (IPEPs) in the ribbon;

forming a first contact electrically coupled to a first location on the ribbon; and forming a second contact electrically coupled to a second location on the ribbon.

\* \* \* \* \*